Figure 1:
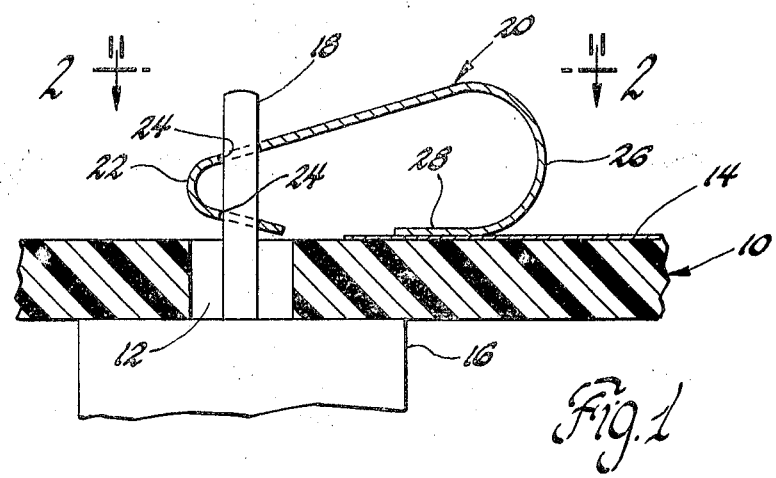

United States Patent [19]

Zurlinden et al.

[11] 4,422,128

[45] Dec. 20, 1983

[54] PUSH-ON TERMINAL CLIP AND ASSEMBLY

[75] Inventors: Donald B. Zurlinden, Goleta; Reginald C. Heltmach, Jr., Santa Ynez, both of Calif.

[73] Assignee: General Motors Corporation, Detroit, Mich.

[21] Appl. No.: 290,692

[22] Filed: Aug. 6, 1981

[51] Int. Cl.³ .............................................. H05K 1/18
[52] U.S. Cl. .................................. 361/408; 174/68.5;
  339/17 C; 339/17 LC; 339/252 R; 339/254 R;
  339/256 S; 361/404
[58] Field of Search .............. 174/68.5; 361/400, 404,
  361/406, 408; 339/17 R, 252 S, 254 R, 256 S,
  256 SP, 258 P, 252 R

[56] References Cited

U.S. PATENT DOCUMENTS

| 2,153,176 | 4/1939 | Douglas | 339/254 R |
| 2,394,020 | 2/1946 | Soreny | 339/256 S |
| 3,027,538 | 3/1962 | Deakin | 339/17 LC X |
| 3,052,004 | 9/1962 | Wallshein | 339/252 R |
| 3,745,513 | 7/1973 | Gross | 361/408 X |

FOREIGN PATENT DOCUMENTS

| 2831448 | 1/1980 | Fed. Rep. of Germany | 361/404 |
| 458111 | 3/1975 | U.S.S.R. | 174/68.5 |

OTHER PUBLICATIONS

G. R. Wilcox, Hole and Pin Electrical Contact, IMB Tech. Disc. Bull., vol. 15, #7, Dec. 1972, pp. 2109 & 2110.

Primary Examiner—R. R. Kucia
Attorney, Agent, or Firm—Warren D. Hill

[57] ABSTRACT

The lead of a T03 style transistor extends through a hole in a printed circuit board. A resilient connector is provided for connecting the transistor lead to a printed circuit conductor in a manner to allow dip soldering but avoiding stress on the lead which might break the glass seal on the transistor package. The connector is a spring clip having a U-shaped portion with a pair of aligned holes in the legs to grip the transistor lead, one of the legs extending into another U-shaped portion which resiliently engages the circuit board conductor when assembled to the transistor lead. The connections are secured by dip soldering to complete the assembly.

3 Claims, 3 Drawing Figures

PUSH-ON TERMINAL CLIP AND ASSEMBLY

This invention relates to a push-on terminal clip and an assembly using such a clip and more particularly to such a clip for connecting component leads to printed curcuit board conductors and the resulting assembly.

Traditionally, printed circuit assemblies comprise an apertured printed circuit board with conductors on one side, components on the other side with the component leads extending through apertures in the board and directly soldered to pads surrounding the apertures through which the leads extend. The usual assembly procedure is to insert the component leads through the circuit board holes, crimp the lead on the conductor side of the circuit board to retain the component and then dip solder or wave solder the underside of the board so that all the leads are soldered to the electrical circuit solder pads in one pass through the solder station. Such a procedure is quick and economical. In the case of the T03 and T066 style power transistors, the emitter/base leads have glass seals around them at the body of the transistor package. It is important to avoid a stress which would break the glass seal and such a stress might arise if the leads were connected directly to solder pads and then subjected to the wave soldering procedure which would give rise to large thermal stresses in the leads. It has been the practice then to hand solder a jumper wire from the transistor lead to a solder pad on the printed circuit conductor to avoid a rigid connection to the circuit board. That extra labor, of course, increases the cost of a printed circuit assembly.

It is therefore a general object of this invention to provide a flexible connection from a component lead to a circuit board conductor requiring no hand soldering. It is a further object to provide such a connection which is amenable to wave soldering.

The invention is carried out by a printed circuit assembly having a clip which easily pushes onto the lead of a component such as a transistor and has an integral resilient portion which extends to the circuit board conductor for contact therewith so that it is self-retained for wave soldering and has sufficient resilience to avoid passing on large thermal stresses to the component.

Figure 2:
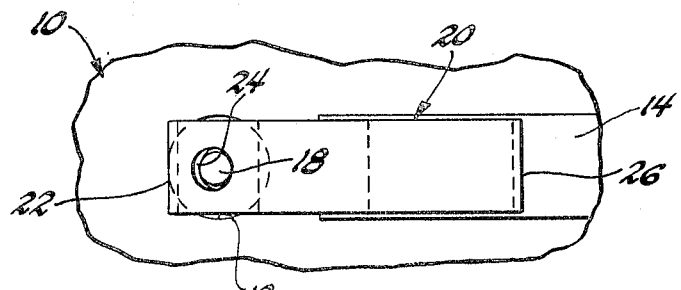
Figure 3:
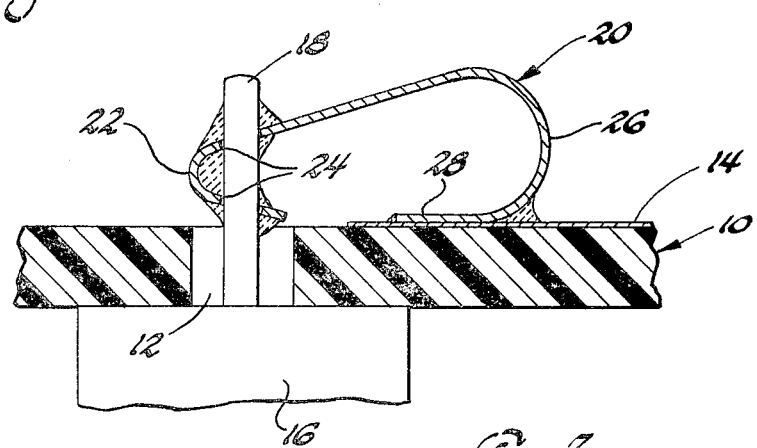

The above and other advantages will be made more apparent from the following specification taken in conjunction with the accompanying drawings wherein like reference numerals refer to like parts and wherein:

FIG. 1 ia a cross-sectional view of a circuit board assembly prior to soldering including a push-on clip according to the invention, and FIG. 2 is a plan view of the clip of FIG. 1 taken along lines 2—2 thereof, and FIG. 3 is a view of the assembly of FIG. 1 with solder applied.

FIG. 1 shows a conventional printed circuit board 10 having an aperture 12 and a conductor 14 on one side of the board. A component 16 such as a T03 style power transistor is mounted on one side of the board opposite the conductor 14 and has a lead 18 extending through the aperture 12. While the transistor 16 may require a heat sink and mounting means therefor that detail is not germane to the subject invention and is omitted from the drawings. An electrical connector comprising a push-on clip 20 engages both the lead 18 and the conductor 14. A first end 22 of the clip 20 is U-shaped with legs diverging at about 30° and has a round aperture 24 in each leg slightly larger than the lead 18 and adapted to slide over the lead 18 so that the lead extends through both holes. Due to the divergence of the legs, the lead intersects each leg at a non-perpendicular angle. The clip is formed of a conductive spring material so the legs of the U-shaped end 22 can be slightly squeezed together to facilitate the insertion of the lead 18 but when released the spring force biases the rims of the apertures 24 against the circumference of the lead 18 to securely frictionally engage or bind the lead. The leg which is farthest from the circuit board 10 is extended to form a resilient portion 26 which is also U-shaped with slightly converging legs and forms the other end of the clip 20. These legs converge at about 15°. The extreme end of the portion 26 is a flat terminal 28 which lies flush against the circuit conductor 14 to make electrical contact therewith. The radius of the U-shaped portion 26 is two or three times larger than the radius of the U-shaped end 22. The openings of the U-shaped parts face one another and the unattached legs of the two parts are spaced and extend toward one another.

A specific example of a clip constructed according to this invention comprises a brass alloy C26800, federal specification QQ-B-613, tempered ½ hard and plated with tin up to a maximum thickness of 0.0001 mm. The material has a thickness of 0.25 mm, a width of 3 mm and the centers of curvature of the two U-shaped parts are spaced by 8.4 mm. The apertures have a diameter of 0.85 mm, although the aperture size varies according to the specific lead size to be used with the clip. The U-shaped end 22 has a radius of about 0.8 mm and the U-shaped portion 26 has a radius of about 2.15 mm.

To fabricate the assembly, the transistor or the component 16 is first assembled to the board with the lead 18 extending through the aperture and then the clip is attached over the lead 18. The clip is pushed toward the circuit board sufficiently to firmly press the terminal 28 flush against the conductor 14 thereby arriving at the structure shown in FIG. 1. Then the assembly is dip soldered or wave soldered to permanently secure the clip 20 to the conductor 14 and the lead 18. The drawing, FIG. 3, illustrates the soldered assembly. Stress due to thermal expansion and contraction during the soldering procedure will not be induced in the lead 18 because of the resilience of the clip.

It will thus be seen that the invention provides a unique assembly as well as a particular clip to make possible the easy fabrication of circuit boards with components such as T03 style transistors without the requirement of manual soldering of jumpers between the leads and the circuit conductors.

The embodiments of the invention in which an exclusive property or priviledge is claimed are defined as follows:

1. An electrical connector for resiliently connecting a component lead to a circuit board conductor comprising a push-on clip formed of conductive spring material, the clip having lead gripping means including a substantially U-shaped end with divergent legs and a lead receiving aperture in each of the legs whereby the clip is adapted by spring action to securely grip a lead inserted through both apertures, and one of the legs having a resilient portion extending from its aperture to terminal means for pressing flush against the circuit board conductor.

2. An electrical connector for resiliently connecting a component lead to a circuit board conductor comprising a push-on clip formed of conductive spring material, the clip having lead gripping means including a substantially U-shaped end with divergent legs and a lead receiving aperture in each of the legs whereby the clip is adapted by spring action to securely grip a lead inserted through both apertures, one of the legs having a resilient U-shaped end with terminal means for pressing against the circuit board conductor, and the openings of the U-shaped ends facing each other.

3. A printed circuit board assembly including an apertured circuit board having a conductor on one side, a component mounted on the other side of the circuit board with a lead extending through an aperture in the circuit board and an electrical connector for resiliently connecting the component lead to the circuit board conductor to minimize stress on the component during fabrication of the assembly; the connector comprising a push-on clip formed of conductive spring material, the clip having lead gripping means including a substantially U-shaped end with divergent legs and a lead receiving aperture in each of the legs whereby the clip is adapted by spring action to securely grip a lead inserted through both apertures, one of the legs having a resilient portion with terminal means for pressing against the circuit board conductor; and solder connections between the lead gripping means and the lead and between the terminal means and the circuit board conductor.

* * * * *